US012775765B1

(12) United States Patent
Pratap et al.

(10) Patent No.: US 12,775,765 B1
(45) Date of Patent: Oct. 27, 2026

(54) AUTOMATED DESIGN SCENARIO EXTRACTION FROM INTEGRATED CIRCUIT DESIGN

(71) Applicant: Synopsys, Inc., Sunnyvale, CA (US)

(72) Inventors: Gaurav Pratap, Uttar Pradesh (IN); Vishal Keswani, New Delhi (IN); Sachin Bansal, Uttar Pradesh (IN)

(73) Assignee: Synopsys, Inc., Sunnyvale, CA (US)

( * ) Notice: Subject to any disclaimer, the term of this patent is extended or adjusted under 35 U.S.C. 154(b) by 750 days.

(21) Appl. No.: 18/099,819

(22) Filed: Jan. 20, 2023

(51) Int. Cl.
*G06F 30/33* (2020.01)
*G06F 30/327* (2020.01)

(52) U.S. Cl.
CPC ............ *G06F 30/33* (2020.01); *G06F 30/327* (2020.01)

(58) Field of Classification Search
CPC ............................... G06F 30/33; G06F 30/327
See application file for complete search history.

(56) References Cited

U.S. PATENT DOCUMENTS 6,839,884 B1 * 1/2005 Narain .................... G06F 30/33 716/106
10,366,201 B1 * 7/2019 Ng ........................ G06F 30/327
11,941,335 B1 * 3/2024 Verma ..................... G06F 30/31
2013/0024830 A1 * 1/2013 Tang .................. G06F 30/3308 716/112
2017/0068765 A1 * 3/2017 Sinnadurai ............ G06F 30/398
2017/0293706 A1 * 10/2017 Bouzouzou ........... G06F 30/327
2019/0311085 A1 * 10/2019 Kipnis ................ G06F 30/3312
2023/0034736 A1 * 2/2023 Singh .................. G06F 30/3315
2023/0106989 A1 * 4/2023 Lee ..................... G06F 30/3315 716/111

* cited by examiner

*Primary Examiner* — Nha T Nguyen
(74) *Attorney, Agent, or Firm* — WOMBLE BOND DICKINSON (US) LLP

(57) ABSTRACT

A method includes: receiving an integrated circuit design including a plurality of design objects; identifying a desired design object associated with a violation in the integrated circuit design; extracting, by a processor, a design tree from the integrated circuit design, the design tree corresponding to a portion of the integrated circuit design including the desired design object and extracted design objects associated with the desired design object; and connecting, by a processing device, the desired design object and the extracted design objects associated with the desired design object based on the connections in the integrated circuit design to generate a reduced design file smaller than the integrated circuit design, wherein the violation is reproducible based on the reduced design file.

20 Claims, 10 Drawing Sheets

AUTOMATED DESIGN SCENARIO EXTRACTION FROM INTEGRATED CIRCUIT DESIGN

TECHNICAL FIELD

The present disclosure relates to electronic design automation for integrated circuits. In particular, the present disclosure relates to automated design scenario extraction from an integrated circuit design.

BACKGROUND

Designs for integrated circuits such as computer processors, graphical processing units, digital signal processors, and system-on-chip (SoC) grow and become more complex as technologies advance and as the market demands grow for more capable products. Electronic design automation software assists engineers in managing this complexity and performs various analyses of the design to validate the designs created by engineers, such as by warning of potential errors or bugs in the design.

The above information disclosed in this Background section is only for enhancement of understanding of the present disclosure, and therefore it may contain information that does not form the prior art that is already known to a person of ordinary skill in the art.

SUMMARY

According to one embodiment of the present disclosure, a method includes: receiving an integrated circuit design including a plurality of design objects; identifying a desired design object associated with a violation in the integrated circuit design; extracting, by a processor, a design tree from the integrated circuit design, the design tree corresponding to a portion of the integrated circuit design including the desired design object and extracted design objects associated with the desired design object; and connecting, by a processing device, the desired design object and the extracted design objects associated with the desired design object based on the connections in the integrated circuit design to generate a reduced design file smaller than the integrated circuit design, wherein the violation is reproducible based on the reduced design file.

The identifying the desired design object may include: receiving debug information associated with the violation, the debug information including a plurality of debug fields corresponding to design objects of the integrated circuit design; assigning a priority to each of the debug fields corresponding to the design objects of the integrated circuit design; and identifying the desired design object based on a corresponding debug field of the plurality of debug fields having a highest priority.

The method may further include: receiving a user-reported issue associated with the violation, the user-reported issue including an identifier of a design object; and identifying the desired design object from among the plurality of design objects in the integrated circuit design based on the identifier of the design object.

The extracting the design tree from the integrated circuit design may include: determining an object type of the desired design object; and traversing a portion of the integrated circuit design from the desired design object based on the object type to collect the extracted design objects.

The method may further include determining one or more of hierarchy tree information and power supply information for each of the extracted design objects.

The object type may be a sink object type, and the portion of the integrated circuit design may be a fan-in cone to the desired design object from one or more sequential objects in the integrated circuit design.

The object type may be a source object type, and the portion of the integrated circuit design may be a fan-out cone from the desired design object to one or more sequential objects in the integrated circuit design.

The object type may be an intermediate object type, and the portion of the integrated circuit design may be a fan-in cone to and a fan-out cone from the desired design object, from one or more sequential objects in the fan-in cone through the desired design object to one or more sequential objects in the fan-out cone.

The connecting the desired design object and the extracted design objects may include: for each design object in a design tree container including the desired design object and the extracted design objects: getting a connected object list for the design object in the design tree container; and connecting the design object to each connected object in the connected object list if the connected object is in the design tree container.

The reduced design file may be in a format consistent with a hardware description language.

According to one embodiment of the present disclosure, a system includes: a memory storing instructions; and a processor, coupled with the memory and to execute the instructions, the instructions when executed cause the processor to: receive a reduced design file, the reduced design file storing a reduced design tree including a plurality of design objects representing a portion of a integrated circuit design, the reduced design tree being smaller than the integrated circuit design; load the reduced design file; and generate a violation report using a static verification system on the reduced design file, the violation report including a violation that is also present in a second violation report generated using the static verification system on the integrated circuit design.

The memory may further stores instructions that, when executed cause the processor to: load auxiliary data associated with the integrated circuit design; and ignore portions of the auxiliary data associated with objects that are present in the integrated circuit design and omitted from the reduced design tree.

The auxiliary data may include: timing information; or power information.

The memory may further stores instructions that, when executed cause the processor to: receive a user-reported issue associated with the second violation report; and generate a third violation report using a modified static verifier on the reduced design file, wherein the third violation report resolves the user-reported issue associated with the second violation report.

According to one embodiment of the present disclosure, a non-transitory computer-readable medium including stored instructions, which when executed by a processor, cause the processor to: receive an integrated circuit design including a plurality of design objects; identify a desired design object associated with a violation in the integrated circuit design, the violation being detected by a static verifier; extract a design tree from the integrated circuit design, the design tree corresponding to a portion of the integrated circuit design including the desired design object and extracted design objects associated with the desired design object; and connect the desired design object and the extracted design objects associated with the desired design object based on connections in the integrated circuit design to generate a reduced design file smaller than the integrated circuit design, wherein the violation detected by the static verifier is reproducible based on the reduced design file.

The instructions to identify the desired design object may include instructions that, when executed, cause the processor to: receive debug information associated with the violation, the debug information including a plurality of debug fields corresponding to design objects of the integrated circuit design; assign a priority to each of the debug fields corresponding to the design objects of the integrated circuit design; and identify the desired design object based on a corresponding debug field of the plurality of debug fields having a highest priority.

The instructions to identify the desired design object may include instructions that, when executed, cause the processor to: receive a user-reported issue associated with the violation, the user-reported issue including an identifier of a design object; and identify the desired design object from among the plurality of design objects in the integrated circuit design based on the identifier of the design object.

The instructions to extract the design tree may include instructions that, when executed, cause the processor to: determine an object type of the desired design object; and traverse a portion of the integrated circuit design from the desired design object based on the object type to collect the extracted design objects, wherein, when the object type is a sink object type, the portion of the integrated circuit design may be a fan-in cone to the desired design object from one or more sequential objects in the fan-in cone, wherein, when the object type is a source object type, the portion of the integrated circuit design may be a fan-out cone from the desired design object to one or more sequential objects in the fan-out cone, and wherein, when the object type is an intermediate object type, the portion of the integrated circuit design may be a fan-out cone and a fan-in cone to the desired design object from the one or more sequential objects in the fan-in cone through the desired design object to the one or more sequential objects in the fan-out cone.

The instructions to connect the desired design object to the extracted design objects may include instructions that, when executed, cause the processor to: for each design object in a design tree container including the desired design object and the extracted design objects: get a connected object list for the design object in the design tree container; and connect the design object to each connected object in the connected object list if the connected object is in the design tree container.

The non-transitory computer-readable medium may further store instructions that, when executed, cause the processor to compute hierarchy tree information for each of the extracted design objects.

BRIEF DESCRIPTION OF THE DRAWINGS

The disclosure will be understood more fully from the detailed description given below and from the accompanying figures of embodiments of the disclosure. The figures are used to provide knowledge and understanding of embodiments of the disclosure and do not limit the scope of the disclosure to these specific embodiments. Furthermore, the figures are not necessarily drawn to scale.

DETAILED DESCRIPTION

Figure 1:
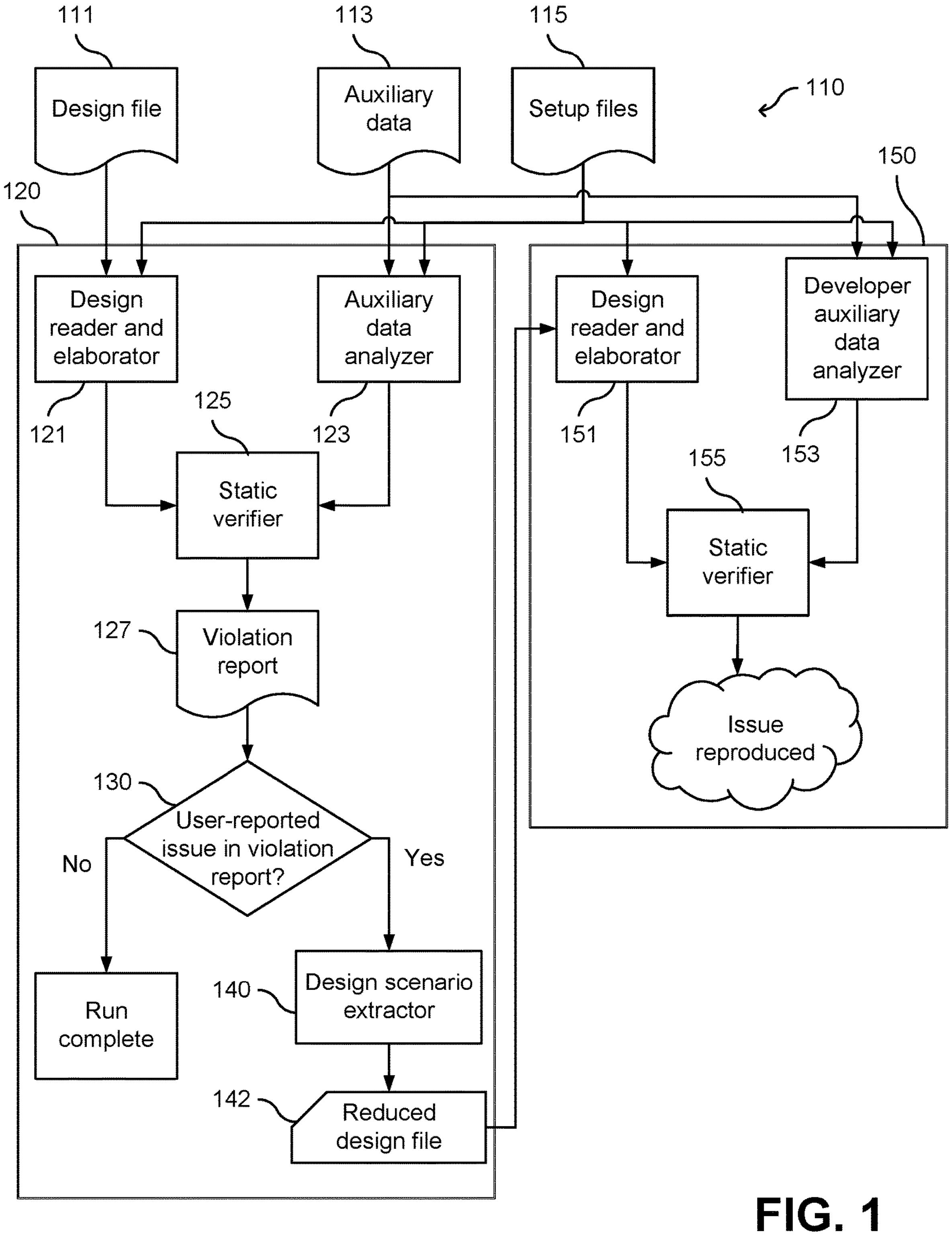
FIG. 1 is a block diagram depicting design scenario extraction software and design scenario loading software according to one embodiment of the present disclosure.

Aspects of the present disclosure relate to automated design scenario extraction from integrated circuit designs.

Designs for many integrated circuits are large and complex, sometimes having on the order of billions of circuit elements. These integrated circuits may include, for example, computer processors (e.g., central processing units (CPUs), graphical processing units (GPUs), specialized hardware accelerators (e.g., artificial intelligence accelerators, network accelerators, etc.), and systems-on-chip (SoCs, which may integrate multiple components together in a single chip). Electronic design automation software helps engineers to manage the enormous task of designing such complex devices, such as by providing representations that allow the engineers to express the designs in terms of logical operations (rather than at the level of individual circuit elements such as transistors or logic gates) and by performing verification of the integrated circuit design.

Verification refers to analyzing the integrated circuit design to detect potential bugs or errors in the design. Dynamic verification refers to analyses where the integrated circuit design is simulated in software (or emulated in reconfigurable hardware) and where the verification system tests whether the simulated or emulated circuit behaves as intended in response to some given input. Static verification refers to analyses performed on the expressed design of the integrated circuit (e.g., the source code representing the integrated circuit design) to detect potential errors in the design. One example of static verification is a low power static verifier which verifies completeness and consistency of low power intent of the design at every implementation stage. Such a low power static verifier uses the design information along with other auxiliary information (UPF) to verify those designs and produces several violations to pinpoint the structural and consistency related low power issues in the design. Each violation instance in a violation report states the type of low power problem present in the design along with structural/auxiliary information through multiple debug fields. Violations contain debug information in the form of debug fields.

In some circumstances, an engineer (or user) may determine that the output of some static verification software is incorrect and may choose to report the problem to the developer of the static verification software. For example, the static verification software may generate a report indicating a problem in the design of the integrated circuit, but the engineer, after performing a manual analysis of the integrated circuit design, may determine that there is no actual problem in the design. In other cases, the static verification software may fail to identify a problem that the engineer believes should have been flagged by the static verification software.

These false positives (e.g., reporting an error when there is none) can cause significant delays in the development of the integrated circuit designs, because of the enormous costs associated with manufacturing an integrated circuit that has an error or bug in its design. Accordingly, the static verification software report may include a requirement that there are no violations prior to proceeding with the design and manufacturing process, and therefore the developers or vendors of static verification software are expected to fix the static verification software on urgent priority.

To analyze the potential bug in the static verification software, the root cause of the issue may need to be identified, for example, by reproducing the error that was observed by the user. However, as discussed above, integrated circuit designs are large and complex (and often proprietary and closely guarded). The size and complexity of the integrated circuit designs means that it may take a long time and a large amount of computer memory for the static verification software to perform its analysis, therefore increasing the amount of time and computing resources needed by the software developer to debug the alleged error in the static verification software. In addition, there may be business reasons for the user to prefer to avoid sharing the full design of the integrated circuit that they are creating. Nevertheless, the software developer needs to be able to reproduce the alleged bug to debug the static verification software.

Therefore, aspects of embodiments of the present disclosure relate to automated techniques for extracting a portion of an integrated circuit design, where the extracted portion is sufficient (e.g., a desired or minimal portion of the integrated circuit design) to reproduce the error reported by the user (e.g., the static verification software can reproduce the violation based on the extracted portion of the integrated circuit design). Other aspects of embodiments of the present disclosure relate to techniques for loading the extracted portion of the full integrated circuit design (which may be missing components that would be present) such that it can be analyzed by the static verification software that is to be debugged.

Technical advantages of the present disclosure include, but are not limited to reducing the effort, time, and computational resources needed to debug the static verification software and increasing user privacy with respect to the full integrated circuit design. For example, analyzing only an extracted portion of the integrated circuit design for debugging purposes reduces the time and computer memory needed for the developer to run the static verification tool for the purposes of debugging (e.g., because the extracted portion is smaller and simpler than the full integrated circuit design). This reduced memory usage is especially relevant because even moderately-sized design files can create debug dumps that are several gigabytes in size and that are difficult to analyze or, in some cases, difficult to even open for inspection. Reducing the size of the design file to a relevant portion (e.g., minimal portion) of the design that is sufficient to reproduce the error (e.g., the error can be reproduced based on this reduced portion of the full design) therefore provides advantages in making debugging the static verifier practical. In addition, software such as a debugger and a profiler for analyzing the operation of a static verifier may require the static verifier (or other such computer program) to be compiled in an unoptimized manner (e.g., with debugging symbols included and various performance optimizations turned off). Running an unoptimized binary executable also usually results in increased run times and increased memory consumption compared to an optimized binary executable. Furthermore, the portions of the design are extracted based on a likelihood of being relevant to the problem observed by the user, such that the software developer does not need to consider the operation of the static verification software on other portions of the integrated circuit design that are not producing the error. In addition, extracting only a portion of the design means that the user does not need to reveal portions of the integrated circuit design that are not relevant to debugging the problem in the static verification software, thereby reducing the chance that part of the integrated circuit design could be leaked to a third-party such as a competitor.

FIG. 1 is a block diagram depicting design scenario extraction software and design scenario loading software according to one embodiment of the present disclosure. As shown in FIG. 1, a user provides input files 110 that, together, specify a design of an integrated circuit. In some embodiments, these input files 110 include a design file 111, auxiliary data 113, and setup files 115. The design file 111 may be, for example, a design of an integrated circuit, which may be specified, for example, as a logical specification in a hardware description language (HDL) or a lower-level description of the integrated circuit (e.g., as a register-transfer level representation or a netlist). The auxiliary data 113 may include, for example, power information (e.g., in Unified Power Format or UPF) and design constraints (e.g., in Standard Design Constraints or SDC format). The setup files 115 may include, for example, timing information files (e.g., a Liberty file format).

During the process of designing the integrated circuit, a user (e.g., an engineer designing the integrated circuit) may choose to perform static verification on the current design of the integrated circuit, and therefore may supply these input files 110 to a first static verification system 120. In some embodiments, the first static verification system 120 is implemented by program instructions stored in a non-transitory computer-readable medium and executed by a processor of a computer to configure the processor to be a special-purpose device that performs static verification to detect potential violations in the design of the integrated circuit. As shown in FIG. 1, the first static verification system 120 includes a design reader and elaborator 121, which is configured to read a supplied design file 111, and which may be configured by appropriate ones of the setup files 115. The design reader and elaborator 121 may parse the design file 111 and further elaborate the parsed data (e.g., generate data based on the parsed data, such as binding modules to module instances, building a model hierarchy, computing parameter values, resolving hierarchical names, establishing net connectivity, and the like). In addition, an auxiliary data analyzer 123 reads the auxiliary data 113 and may also be configured by appropriate ones of the setup files 115.

The parsed and elaborated design data and the auxiliary data are supplied to a static verifier 125, which performs static verification of the design and generates a violation report 127 based on its analysis. The violation report 127 identifies portions of the design that violate some requirement specified by the static verifier. Different types of static verifiers may detect different types of violations, such as timing violations (e.g., critical timing paths where signals arrive too early or too late or clock skew issues), power issues (e.g., power intent consistency checks, checking compliance with power architecture rules, and insertion and connection of power-related components in the design such as isolation cells, power switches, and level shifters in the design), placement or spacing violations (e.g., circuit elements laid out too close or overlapping one another), and the like.

A user reviewing the violation report 127 may determine that report contains an error. Errors may include false positives—where a violation was erroneously reported where there should not have been an error—and false negatives—where a violation was not reported when it should have been reported. Aspects of embodiments of the present disclosure provide an interface for a user to report that there is an error (or errors) in the violation report. At 130, the first static verification system 120 determines whether there is a user-reported issue in the violation report (e.g., in response to receiving a user input). In a case where there is no user-reported issue, then the run of the static verification system 120 in response to the given input files 110 is complete. In a case where there is a user-reported issue, then a design scenario extractor 140 generates a reduced design file 142 based on the input design file 111, where the reduced design file 142 contains a portion of the full design that is sufficient to reproduce the user-reported issue in the violation report. As used herein, an extracted design scenario refers to a design tree containing a test case that has a subset of design objects or design elements (e.g., represented in a design tree container data structure) and also includes hierarchical info and power information. The second static verification system can load the extracted design scenario together with auxiliary data as provided by an end user (e.g., that is not modified from its original version).

Figure 2:
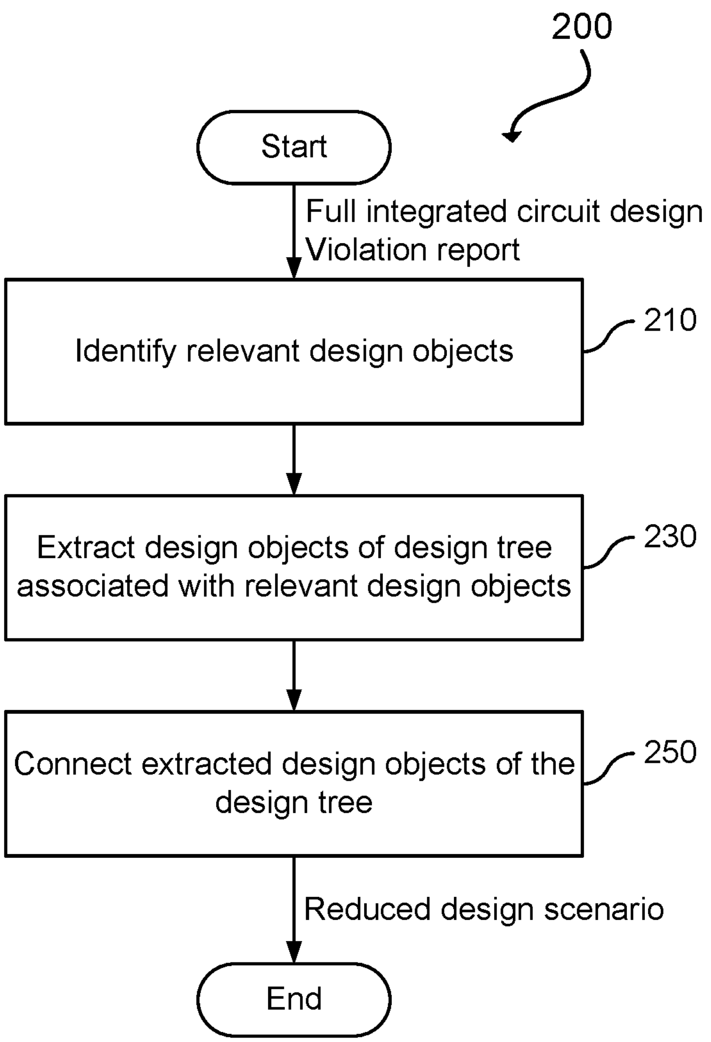
FIG. 2 is a flowchart depicting a method for extracting a design scenario according to one embodiment of the present disclosure.

FIG. 2 is a flowchart depicting a method 200 for extracting a design scenario according to one embodiment of the present disclosure. Extracting a design scenario according to various embodiments of the present disclosure may be performed, for example, by a processor of a computer system executing instructions stored in a non-transitory computer-readable memory, where the instructions, when loaded into a memory of the computer system and executed by the processor of the computer system, configure the computer system to be a special purpose device that extracts a design scenario from a given design. As the term is used herein, a design scenario refers a portion of a full integrated circuit design. In the embodiment shown in FIG. 2, the method 200 takes, as input, the full integrated circuit design (e.g., that was parsed and elaborated based on the input design file 111) and the violation report 127.

To extract the design scenario (e.g., a portion of the integrated circuit design) from the full integrated circuit design, the design scenario extractor 140 starts from at least one desired design object within the full integrated circuit design that is relevant to the violation of concern (e.g., the violation that is subject of the user-reported issue in the violation report). In some embodiments, design objects of the full integrated circuit design are considered to be relevant to the violation if those design objects need to be present in the design for the static verifier to detect the violation (e.g., the violation depends on those design objects, such that modifying that design object may result in a change in the detection of the violation by the static verifier), whereas other design objects may be irrelevant to a violation because they are in portions of the integrated circuit design that are independent of that violation (e.g., the violation is independent of those irrelevant design objects, such that modifications to those irrelevant design objects do not affect the detection of the violation by the static verifier). The desired design object may be identified by its unique name, as specified in the full integrated circuit design (e.g., where each design object may correspond to a single pin of a circuit element such as a logic gate or register, a single port of a circuit portion, or a net connecting two pins). The identified desired design object of concern (or multiple identified desired design objects) may also be categorized into one of three types: source (where only the fanout cone of the design object is relevant to the violation, such as where the design object is at an output of a sequential circuit element); sink (where only the fan-in cone of the design object is relevant to the violation, such as where the design object is at an input of a sequential circuit element); or intermediate (where both the fan-in cone and the fanout cone are relevant to the violation, such as a net between two combinational circuit elements).

At 210, the computer system identifies desired design objects in a given integrated circuit design. In some embodiments, the user directly specifies the desired design object (e.g., by its name or by selecting the design object in a graphical user interface) that is associated with the erroneous violation, and therefore the computer system receives the identification as an additional input.

In some embodiments of the present disclosure, the design scenario extractor 140 automatically extracts the desired design object based a violation marker (e.g., a violation identifier) associated with the user-reported issue in the violation report 127. For example, the violation report 127 may specify, for each violation, one or more names of design objects in the full integrated circuit design that are associated with that violation (e.g., a cell of the integrated circuit design where a critical timing path results in timing violation such as a setup violation or hold violation or a cell where the power intent is incorrect). A user reviewing the violation report 127 may then identify the erroneous violation (e.g., by selecting the erroneous violation in a graphical user interface or providing a violation identifier in a command line interface) when reporting the error in the violation report 127.

To automatically extract the one or more desired design objects based on the violations, in some embodiments, the design scenario extractor 140 assigns a priority to each of the debug fields of the each of the violations that were flagged by the user as being incorrect or erroneous, where each of the debug fields corresponds to a different design object in the full integrated circuit design (e.g., where each design object may correspond to a single pin or port of a circuit element such as a logic gate or register). Table 1A, below, shows an example of a violation report with debug fields 1 through n.

TABLE 1A

| Viol Name: VIOL_CLAIM Debug fields: |
| --- |
| Debug 1 |
| Debug 2 |
| Debug 3 |
| Debug 4 |
| . . . |
| Debug n |

Table 1B, below, shows an example of the violation report annotated with priorities assigned by the design scenario extractor 140 and field types determined by the design scenario extractor 140.

TABLE 1B

| Viol Name: VIOL_CLAIM Debug fields: | | |
| --- | --- | --- |
| | Priority | Field Type |
| Debug 1 | 2 | Source |
| Debug 2 | 2 | Intermediate |
| Debug 3 | 1 | Sink |
| Debug 4 | 3 | Sink |
| . . . | . . . | |
| Debug n | 3 | Source |

In some embodiments of the present disclosure, the design scenario extractor 140 assigns priorities to the debug fields based on static definitions that are set for each type of violation that can be reported by the static verifier in a violation report. The definitions are specific to the statically detected violation, such as a power intent consistency violation versus a structural and power and ground (PG) violation. For example, when detecting a violation, particular design objects in the integrated circuit design being analyzed may contribute to the violation in particular ways, where the debug fields may correspond to the roles played by the different design objects in the design. For example, a sub-circuit of the design may operate in different modes—such as on, sleep, and off—which may have different operating voltages, and the static verifier of the power intent may detect a violation where the incorrect voltages may be supplied to the sub-circuit under some conditions. In such an example, the nets that supply the power to the sub-circuit have different roles than the nets that relate to the logic that selects the power based on the operating mode or other conditions, and therefore the different design objects that correspond to these different contributors to the violation are assigned to corresponding debug fields in the violation. As such, priorities can be assigned to the debug fields by a developer of the static verifier based on, for example, the centrality of those roles to the violation that is detected for the purpose of extracting a portion of the design for reproducing the violation.

In some embodiment of the present disclosure, the field types are determined automatically based on the type of design object associated with the debug field. For example, in a case where the debug field corresponds to an input pin, then the design scenario extractor determines that the design object can act only as a sink field type, whereas, if the debug field corresponds to an output pin, then the design scenario extractor determines that the design object can act only as a source field type. On the other hand, if the debug field corresponds to an intermediate net or port (e.g., takes an input from other cells in the integrated circuit design and outputs signals to other cells in the integrated circuit design), then the debug field has an intermediate field type.

In the example of Table 1A and Table 1B shown above, because debug field Debug 3 was assigned first priority, then the design object associated with debug field 3, having a sink field type, is identified as the relevant field for the shown violation (VIOL_CLAIM). This process of identifying desired design objects may be repeated for each user-reported erroneous violation in the violation report 127 to collect corresponding desired design objects.

At 230, the computer system extracts design objects of a design tree corresponding associated with the desired design objects in the integrated circuit design.

Figure 3A:
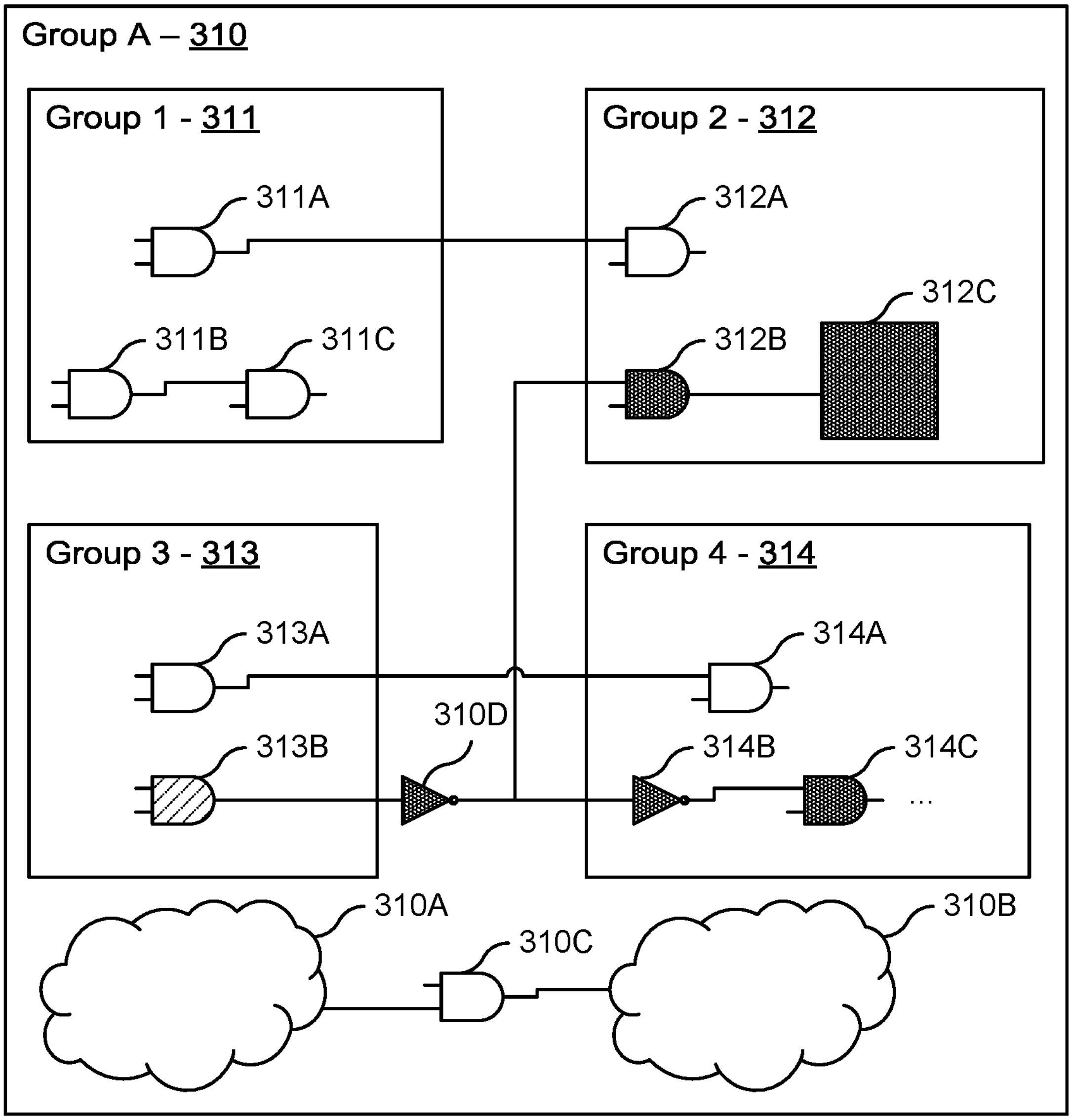
FIG. 3A is a schematic block diagram illustrating a portion of a full integrated circuit design that includes a desired design object and a design scenario to be extracted according to one embodiment of the present disclosure.

FIG. 3A is a schematic block diagram illustrating a portion of a full integrated circuit design 310 that includes a desired design object and a design scenario to be extracted according to one embodiment of the present disclosure. Based on the desired design object and its type, the design scenario extractor 140 executed by the processor of the computer system identifies all the design objects which need to be present in the extracted design tree or extracted design scenario to reproduce the violation reported by the static verifier.

In the example shown in FIG. 3A, the full integrated circuit design is organized into a hierarchy of circuit elements. FIG. 3A shows a portion of the circuit hierarchy including Group A-310. Group A-310 includes a first group (Group 1-311), a second group (Group 2-312), a third group (Group 3-313), and a fourth group (Group 4-314). Group A 310 may also include other circuit elements depicted as first network 310A and second network 310B, which may be connected by other circuit elements such as an AND gate 310C. Circuit elements in different groups may also be connected by circuit elements at a higher level of the hierarchy, such as invertor 310D, which is at the level of Group A-310. The first group 311 includes a first AND gate 311A, a second AND gate 311B, and a third AND gate 311C, where an output of the second AND gate 311B is connected to an input of the third AND gate 311C and an output of the first AND gate 311A is connected to an input of a first AND gate 312A of the second group 312. The second group 312 further includes a second AND gate 312B and a flip-flop 312C. The third group (Group 3-313) includes a first AND gate 313A having an output connected to a first AND gate 314A of the fourth group 314. The third group also includes a second AND gate 313B having an output connected to the inverter 310D, where the inverter 310D has its output connected to an input of the second AND gate 312B of the second group 312 and an inverter 314B of the fourth group 314. The fourth group 314 further includes a second AND gate 314C connected to an output of the inverter 314B of the fourth group 314.

Figure 3B:
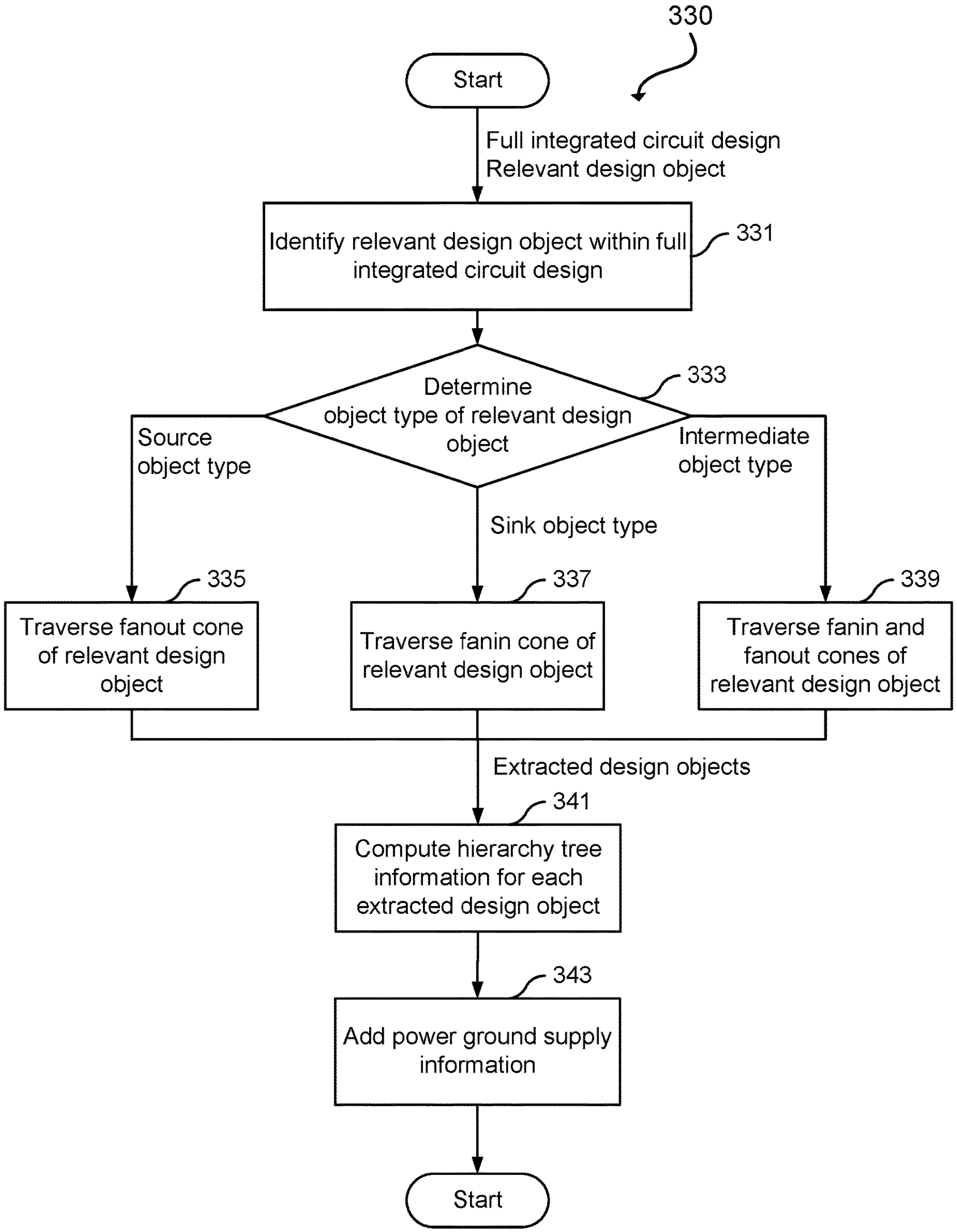
FIG. 3B is a flowchart of a method for extracting design objects in a design tree corresponding to the desired design object according to one embodiment of the present disclosure.

FIG. 3B is a flowchart of a method 330 for extracting a design tree of design objects corresponding to the desired design object according to one embodiment of the present disclosure. At 331, the computer system identifies the desired design object within the full integrated circuit design. For example, if the desired design object was identified by its unique design object name or other identifier within the full integrated circuit design, the computer system identifies the location of the desired design object based on that design object name or identifier. In the example shown in FIG. 3A, the desired design object is the output pin of the second AND gate 313B of the third group 313, where the second AND gate 313B is shown with diagonal shading to indicate that it is the identified desired design object.

At 333, the computer system determines the object type of the desired design object to select the traversal direction for identifying the design tree based on the desired design object. In a case where the desired design object is a source object type, then at 335, the computer system traverses the fan-out cone of the desired design object as an input to its corresponding output(s). In a case where the desired design object is a sink object type, then at 337, the computer system traverses the fan-in cone of the desired design object as an output to its corresponding input(s). In a case where the desired design object is an intermediate object type, then at 335, the computer system traverses both the fan-in cone and the fan-out cone of the desired design object as an input and an output to its corresponding output(s) and input(s) respectively.

In some embodiments, the design scenario extractor proceeds with a depth first search graph traversal on the complete design graph, although embodiments of the present disclosure are not limited thereto and may, for example, use a breadth first search graph traversal on the design graph. The traversal of the fan-in cone and/or fan-out cone of the desired design object proceeds until the computer system reaches a sequential object (e.g., flip-flop, latch, etc.), passing through all intermediate nodes (e.g., combinational circuit objects) between the desired design object and the sequential objects in the fan-out cones.

In the example shown in FIG. 3A where the output pin of the second AND gate 313B of the third group 313 is identified as the desired design object, the computer system determines that the output pin of the second AND gate 313B is a source object type, and therefore the computer system traverses the fan-out cone from the output pin. This fan-out cone includes the input pin of the inverter 310D to its output pin, which is connected to the input pin of the second AND gate 312B of the second group 312 and the input pin of the inverter 314B of the fourth group 314. The output pin of the second AND gate 312B is connected to flip-flop 312C. Because the flip-flop 312C is a sequential element, the traversal of the branch from the ends there. Continuing with the other branch from the output of the inverter 310D that is connected to the inverter 314B of the fourth group 314, its output is connected to the input of the second AND gate 314C of the fourth group. Other elements may further be connected to the output of the second AND gate 314C, as indicated by the ellipses in FIG. 3A. All of the circuit elements in the fan-out cone of the second AND gate 313B (the desired design object) are shaded in FIG. 3A to indicate that they are included in the design tree associated with the desired design object, and circuit elements that are not part of the design tree are shown with unshaded (e.g., plain) interiors.

The set of the design objects (e.g., pins, ports, and nets) reached during the design traversal (e.g., of the fan-in cone for a sink object type, fan-out cone for a source object type, or fan-in and fan-out cones for an intermediate object type) are part of the extracted-out design tree for the reduced test case or design scenario. In some embodiments, these design objects are stored in a container data structure (e.g., a design tree container). The computer system also obtains the connectivity among the extracted design objects from the design graph of the original, full integrated circuit design (e.g., identifying the connections between nets, output pins, and input pins corresponding to the design objects extracted during traversal).

Some aspects of embodiments of the present disclosure further relate to collecting the full hierarchy information for each of the extracted design objects. As noted above, the design of an integrated circuit may have elements organized in a hierarchical structure. The example shown in FIG. 3A depicts a parent group A 310, which has four groups (Group 1-311, Group 2-312, Group 3-313, and Group 4-314) beneath it, along with other circuit portions such as the first network 310A, the second network 310B, the AND gate 310C, and the inverter 310D. Each of these circuit elements may be referred to in accordance with a hierarchy or path (e.g., the second AND gate 312B in Group 2 may have a full path that describes its location in the hierarchy, such as: "Group A-310/Group 2-312/AND Gate 312B"). At 341, the computer system computes hierarchy tree information for each extracted design object that was identified during the traversal of the design graph (e.g., identified as part of the fan-in cone or fan-out cone, as appropriate based on the object type of the desired design object).

Figure 3C:
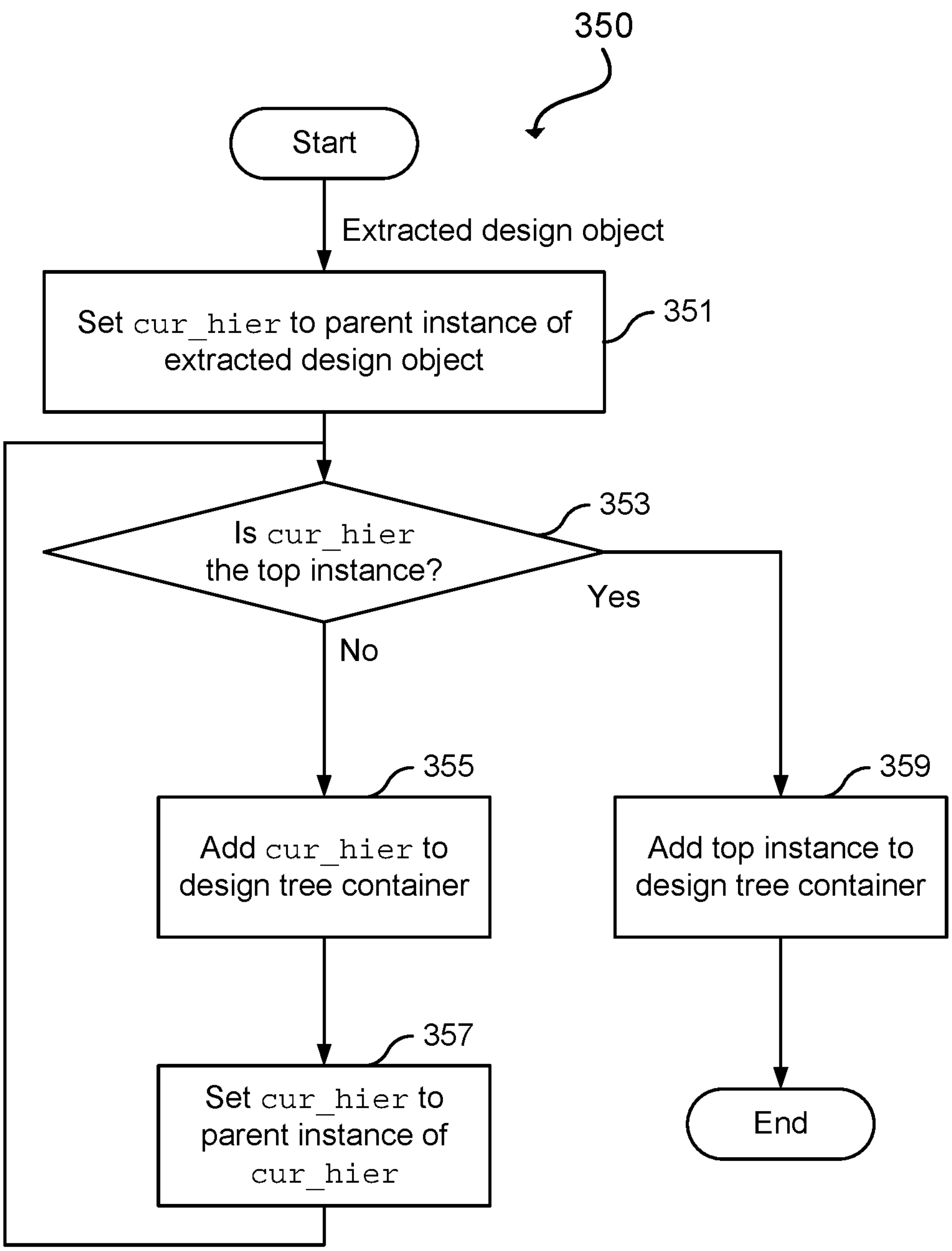
FIG. 3C is a flowchart of a method for determining the hierarchy tree information for an extracted design object according to one embodiment of the present disclosure.

FIG. 3C is a flowchart of a method 350 for determining the hierarchy tree information for an extracted design object according to one embodiment of the present disclosure. As shown in FIG. 3C, at 351, given an extracted design object, the computer system sets a variable (labeled in this example as "cur_hier") to the parent instance of the extracted design object. At 353, the computer system determines whether the instance referenced by the cur_hier variable is the top instance of the integrated circuit design (e.g., the top or root of the hierarchy). In a case where the instance referenced by the cur_hier variable is not the top instance of the integrated circuit design, then the instance referenced by the cur_hier variable is added to the design tree container (which represents or holds the objects of an extracted design tree), and, at 357, the cur_hier variable is set to the parent of the instance that is currently referenced by the cur_hier variable. In a case where the instance referenced by the cur_hier variable is the top instance, then the top instance is added to the design tree container, and the extraction of the hierarchy for the given design object is complete.

In some circumstances, the parent instance to be added by an extracted design object will already be present in the design tree container, and therefore the previously computed results may be reused for the current extracted design object.

Referring again to FIG. 3B, at 343, the computer system adds power and ground supply information to the design tree container, such that the power information from the original design is also included in the extracted design scenario that includes the extracted design tree.

Referring back to FIG. 2A, after extracting the design tree, the computer system, at 250, connects the extracted design objects of the design tree to produce the extracted design scenario or reduced design scenario, which can then be written out to generate a reduced design file and sent to the developer of the static verification software (e.g., the vendor of the static verification software) to assist the developer of the static verifier in reproducing the user-reported issue in the violation report 127.

Figure 4:
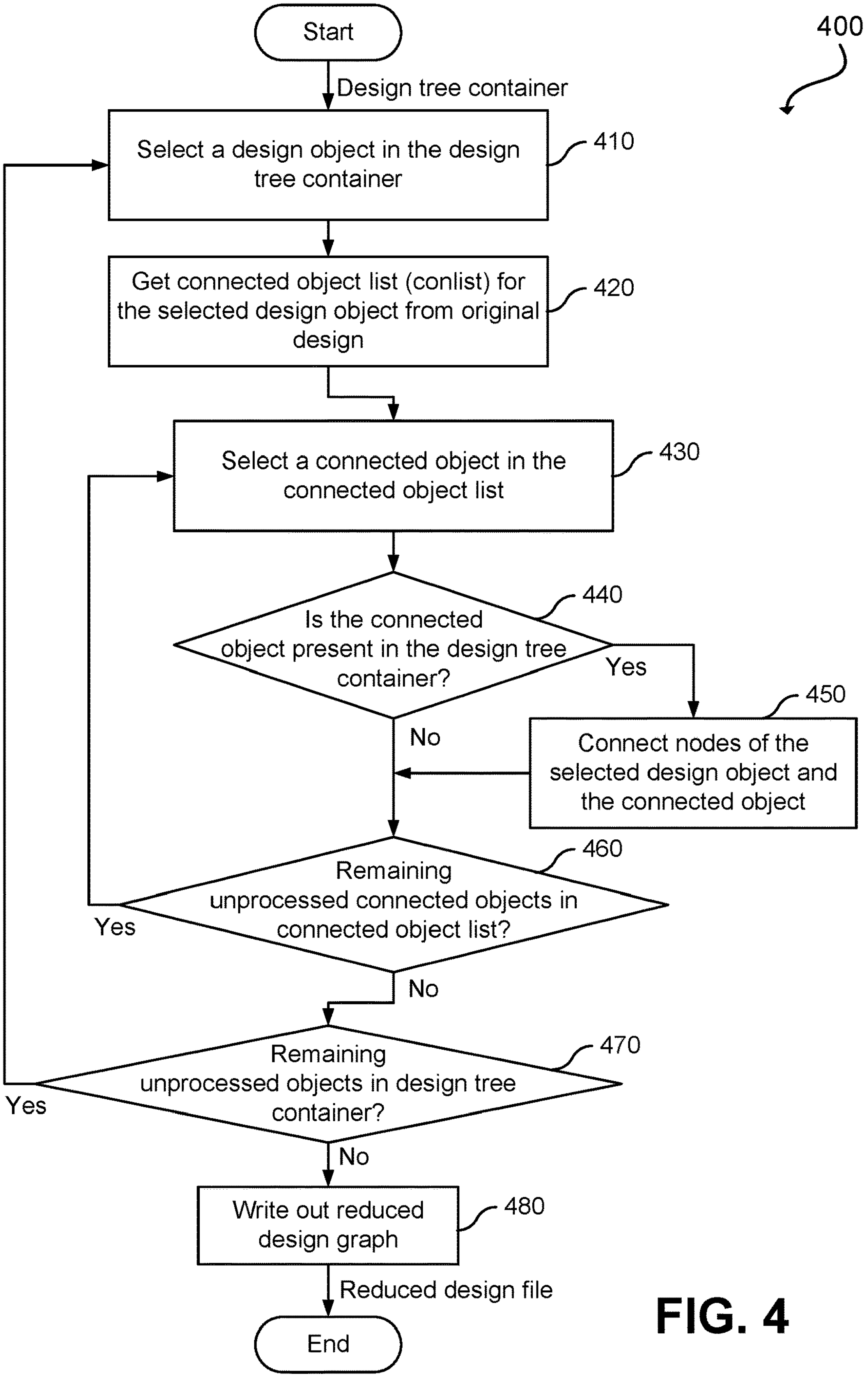
FIG. 4 is a flowchart of a method for writing out an extracted design tree according to one embodiment of the present disclosure.

In some embodiments, a design tree exporter or writer of the design scenario extractor 140 takes the list of design objects collected in the design tree extraction as input, as shown in FIG. 4. Connectivity information of the design objects will be obtained from the original design graph. Based on these two inputs, a reduced design graph will be created which will be a subset of the original design graph.

FIG. 4 is a flowchart of a method 400 for connecting the extracted design objects of an extracted design tree according to one embodiment of the present disclosure. Given a design tree container containing a number of extracted objects, the computer system selects a design object in the design tree container at 410 as part of a process for iterating over all of the objects in the design tree container. At 420, the computer system gets a connected object list (or conlist) for the selected design object, where the connected object list is computed from the original (full) design of the integrated circuit. This connected object list includes all objects that were connected to the selected design object in the full design. At 430, the computer system starts a process for iterating over all of the objects in the connected object list by selecting a connected object from the connected object list. At 440, the computer system determines if the connected object is present in the design tree container (e.g., if the connected object is among the extracted nodes). If the connected object is present in the design tree container at 440, then the computer system connects, at 450, the nodes of the selected design object and the connected object within the design tree container, in accordance with their connections in the full design, and the computer system proceeds to 460. If the connected object is not present in the design tree container at 440, then the connected object is skipped over (e.g., ignored or omitted from the connections of the selected design object), and the computer system proceeds to 460.

At 460, the computer system determines if there are any remaining unprocessed connected objects in the connected object list, as a part of iterating through the list of connected objects. In a case where there are unprocessed connected objects, then the computer system continues the iteration process by selecting a next connected object from the connected object list at 430. If there are no additional unprocessed connected objects at 460, the computer system proceeds to 470, with evaluating whether there are additional unprocessed objects in the design tree. If there are remaining unprocessed objects in the design tree container at 470, the computer system proceeds with selecting a next design object in the design tree container at 410. If all of the objects in the design tree container have been processed at 470, the computer system writes out the reduced design graph at 480.

Figure 5:
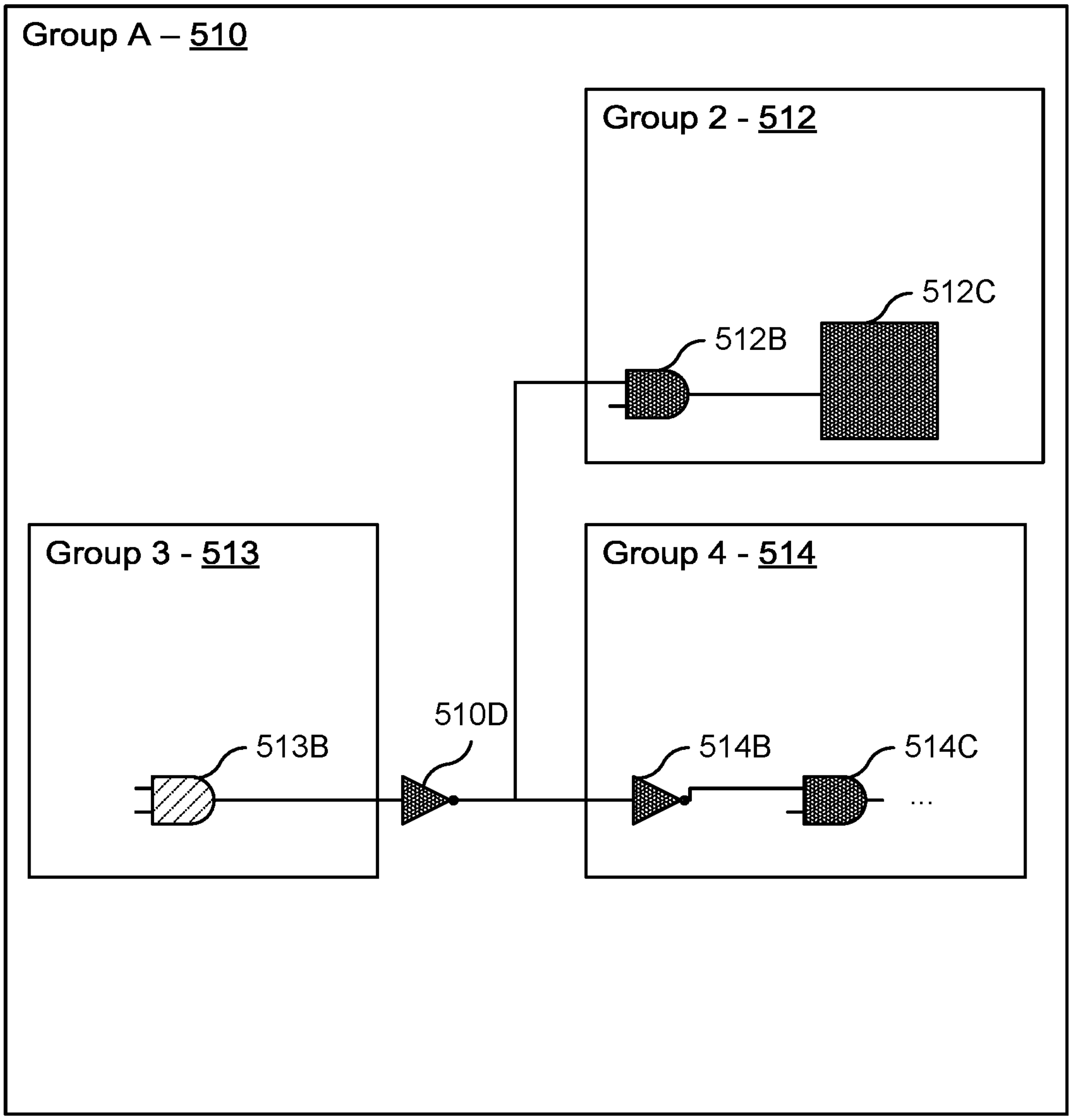
FIG. 5 depicts an extracted design tree corresponding to the desired design object according to one embodiment of the present disclosure.

FIG. 5 depicts an extracted design tree corresponding to the desired design object according to one embodiment of the present disclosure. As shown in FIG. 5, the extracted design tree is a portion of the full design of the integrated circuit (e.g., is smaller than the full design of the integrated circuit) because it omits portions of the full design of the integrated circuit that are not relevant to determining the cause of the erroneous violation. In more detail, the extracted design tree includes parts of the circuit that are within the fan-in cone of the desired design object (for a sink type object), within the fan-out cone of the desired design object (for a source type object), or within the fan-in or fan-out cones of the desired design objects (for an intermediate type object), and excludes other parts of the circuit. In the example of FIG. 5, the extracted design tree includes the parent (e.g., top) instance of Group A 510, the second group 512, the third group 513, and the fourth group 514, but the instance of Group A 510 excludes parts of the full design that are not connected to the desired design object 513B (e.g., the entire first group 511, the first network 310A, the second network 310B, and the AND gate 310C). Within each of the included groups, only the portions of the full design that are connected to the desired design object are included in the extracted design tree. For example, the second group 512 includes the second NAND gate 512B and the flip-flop 512C (but excludes the first AND gate 312A), the third group 513 includes the second AND gate 513B (but excludes the first AND gate 313A), and the fourth group includes the inverter 514B and the second AND gate 514C (but excludes the first AND gate 314A). The extracted design tree also includes the inverter 510D that is directly under Group A 510. The extracted design tree also includes the full power and ground networks and their connection to the instances in the hierarchy, as specified in the full design of the integrated circuit.

In various embodiments of the present disclosure, the written out (or exported or dumped) design graph may have different formats. In some embodiments, the choice of format for the exported design graph depends on customer preferences or requirements for debugging.

In some embodiments, the exported design graph is stored in a format corresponding to a representation in an HDL, such as a plain Verilog format. An exported extracted design scenario in an HDL format is generally more flexible and can be used across tools and across versions of static verifiers, and is also human-readable (e.g., the HDL source code can be readily understood by a skilled engineer).

In some embodiments, the exported design graph is stored in a binary format, which can also be encrypted. This is in a generally non-human readable format. This format may be helpful in cases where the user does not want others to be able to read the RTL logic of the design.

Referring again to FIG. 1, the design scenario extractor 140 produces a reduced design file 142, such as by applying the techniques described above with respect to FIG. 2, FIG. 3A, FIG. 3B, FIG. 3C, FIG. 4, and FIG. 5, where the reduced design file 142 is a portion (e.g., a subset) of the full design of the integrated circuit. The reduced design file 142 contains sufficient information (e.g., sufficient portions of the full integrated circuit design) for the static verifier 125 to reproduce a violation that appears in the violation report 127 that the user has flagged as being erroneous. The reduced design file 142 can then be provided to a software developer (e.g., the developer of the static verifier 125), for example, as part of a bug report.

In some embodiments, a second static verification system 150 as shown in FIG. 1 is implemented by program instructions stored in a non-transitory computer-readable medium and executed by a processor of a computer to configure the processor to be a special-purpose device that performs static verification to detect potential violations in the design of the integrated circuit. The second static verification system 150 may be used by a software developer of the static verifier to debug problems exhibited by the static verifier (e.g., such that the developer can modify the static verifier to correct those bugs). Accordingly, aspects of embodiments of the present disclosure relate to a second static verification system 150 that is configured to reproduce the issues reported by an end-user based on the extracted design scenario provided by the user in a reduced design file 142 and based on auxiliary data 113 and setup files 115, which may also be provided by the user or generally available (e.g., standard files as part of a publicly available library). In more detail, the second static verification system 150 includes a design reader and elaborator 151 similar to the design reader and elaborator 121 of the first static verification system 120.

The second static verification system 150 may also include a developer auxiliary data analyzer 153. A test case includes the design files along with auxiliary data and liberty files. The auxiliary data (e.g., UPF, SDC, etc.) contains the references to the design objects in the design file. A design reader and elaborator 121, an auxiliary data analyzer 123, and other software may flag errors while parsing auxiliary data files and setup files if the design objects referenced in those files are not found in the design files. These missing design objects would likely be indicative of problems in the design file 111, the auxiliary data 113, and/or the setup files 115 at the first static verification system 120. However, in the case of a second static verification system loading a reduced design file 142, such missing objects are regularly expected, because the reduced design file 142 intentionally omits design objects that were part of the original design file 111 and that are not relevant to reproducing the user-reported issue in the violation report.

As such, some aspects of embodiments of the present disclosure relate a developer auxiliary data analyzer 153 that suppresses (or does not generate) the errors that are detected due to missing design objects and proceeds with the execution anyway. Annotation of auxiliary data constructs on the remaining portion of design will not get impacted due to suppression of errors.

Figure 6:
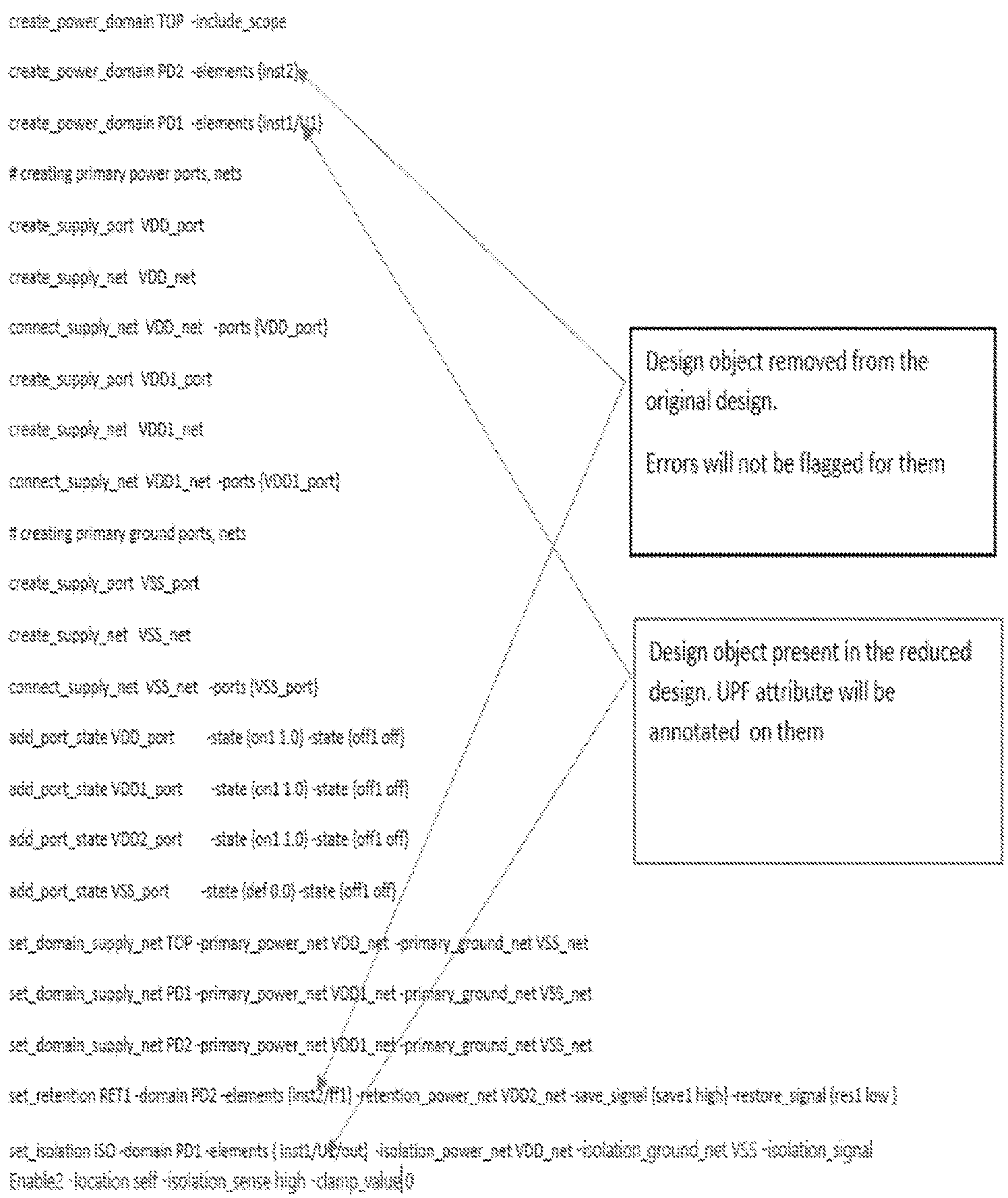
FIG. 6 depicts a portion of a Universal Power Format (UPF) data file as an example of an auxiliary data file that includes portions that are ignored or whose errors are suppressed according to one embodiment of the present disclosure.

FIG. 6 depicts a portion of a Universal Power Format (UPF) data file as an example of an auxiliary data file that includes portions that are ignored or whose errors are suppressed according to one embodiment of the present disclosure. In more detail, the example auxiliary data shown in UPF creates a power domain for a design object "inst2" and another power domain for design object "inst1/U1," but "inst2" from the original design is assumed to have been omitted from the reduced design file, while "inst1/U1" remains in the reduced design file. While it would be possible for a user to attempt to manually remove the portions of the auxiliary data 113 that reference design objects that are missing from in the reduced design file 142, doing so would be tedious and time consuming, which would increase the amount of time needed for a software developer to determine the cause of the issue in the violation report. Accordingly, some aspects of embodiments of the present disclosure relate to a developer auxiliary data analyzer 153 that automatically ignores portions of the auxiliary data 113 that refer to design objects that are not present in the reduced design file 142.

After loading and elaborating the reduced design file 142 using the developer design reader and elaborator 151 and loading the auxiliary data using the developer auxiliary data analyzer 153, the second static verification system supplies the loaded data to a static verifier 155. If the static verifier 155 is the same software code (e.g., the same version) as the static verifier 125 of the first static verification system 120, then the user-reported issue in the violation report should be reproduced in a violation report produced by the static verifier 155. As such, the developer of the static verifier 125 can reproduce the issues observed by the user and determine, for example, whether this is an actual issue with the static verifier or if it is a bug that should be fixed, and may also use the second static verification system 150 to test modified versions of the static verifier 155 to determine of changes to the static verifier 155 have resolved the user-reported issue, based on the reduced design file 142 generated by the first static verification system 120.

Accordingly, aspects of embodiments of the present disclosure relate to methods to improve the process of debugging problems in static verifiers for integrated circuit designs. In more detail, some aspects of embodiments of the present disclosure relate to automatically extracting relevant portions of an integrated circuit design for the purpose of reproducing the error (e.g., generating the same violation report of violations detected by the static verifier) using the smaller, extracted portion of the full integrated circuit design. The use of a smaller portion of the integrated circuit design for debugging reduces the time needed to perform any given run (e.g., thereby allowing time for more iterative cycles in the processing of trying to fix the bug) and reduces the computation time and memory consumption associated with the debugging process.

Figure 7:
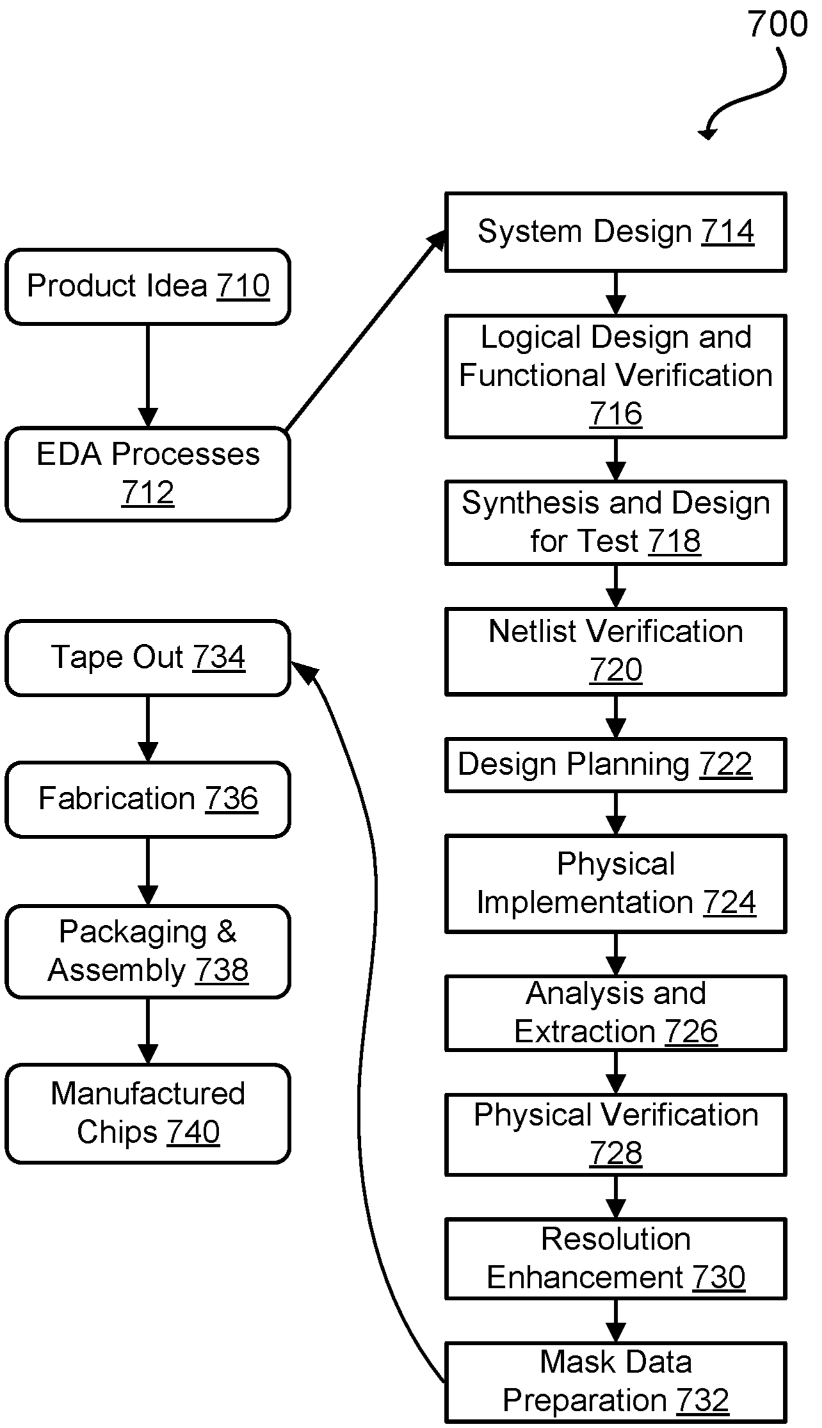
FIG. 7 depicts a flowchart of various processes used during the design and manufacture of an integrated circuit in accordance with some embodiments of the present disclosure.

FIG. 7 illustrates an example set of processes 700 used during the design, verification, and fabrication of an article of manufacture such as an integrated circuit to transform and verify design data and instructions that represent the integrated circuit. Each of these processes can be structured and enabled as multiple modules or operations. The term 'EDA' signifies the term 'Electronic Design Automation.' These processes start with the creation of a product idea 710 with information supplied by a designer, information which is transformed to create an article of manufacture that uses a set of EDA processes 712. When the design is finalized, the design is taped-out 734, which is when artwork (e.g., geometric patterns) for the integrated circuit is sent to a fabrication facility to manufacture the mask set, which is then used to manufacture the integrated circuit. After tape-out, a semiconductor die is fabricated 736 and packaging and assembly processes 738 are performed to produce the finished integrated circuit 740.

Specifications for a circuit or electronic structure may range from low-level transistor material layouts to high-level description languages. A high-level of representation may be used to design circuits and systems, using a hardware description language ('HDL') such as VHDL, Verilog, System Verilog, SystemC, MyHDL or OpenVera. The HDL description can be transformed to a logic-level register transfer level ('RTL') description, a gate-level description, a layout-level description, or a mask-level description. Each lower representation level that is a more detailed description adds more useful detail into the design description, for example, more details for the modules that include the description. The lower levels of representation that are more detailed descriptions can be generated by a computer, derived from a design library, or created by another design automation process. An example of a specification language at a lower level of representation language for specifying more detailed descriptions is SPICE, which is used for detailed descriptions of circuits with many analog components. Descriptions at each level of representation are enabled for use by the corresponding systems of that layer (e.g., a formal verification system). A design process may use a sequence depicted in FIG. 7. The processes described by FIG. 7 may be enabled by EDA products (or EDA systems).

During system design 714, functionality of an integrated circuit to be manufactured is specified. The design may be optimized for desired characteristics such as power consumption, performance, area (physical and/or lines of code), and reduction of costs, etc. Partitioning of the design into different types of modules or components can occur at this stage.

During logic design and functional verification 716, modules or components in the circuit are specified in one or more description languages and the specification is checked for functional accuracy. For example, the components of the circuit may be verified to generate outputs that match the requirements of the specification of the circuit or system being designed. Functional verification may use simulators and other programs such as testbench generators, static HDL checkers, and formal verifiers. Functional verification includes, for example, using the static verification systems described herein to check the integrated circuit design. Accordingly, users may detect problems in the static verification systems, and a design scenario extractor according to embodiments of the present disclosure may be used to extract a portion of the integrated circuit design, where the extracted portion of the integrated circuit design may be provided to a developer of the static verification system to reproduce the error in the static verification system as part of a process of debugging the static verification system. In some embodiments, special systems of components referred to as 'emulators' or 'prototyping systems' are used to speed up the functional verification.

During synthesis and design for test 718, HDL code is transformed to a netlist. In some embodiments, a netlist may be a graph structure where edges of the graph structure represent components of a circuit and where the nodes of the graph structure represent how the components are interconnected. Both the HDL code and the netlist are hierarchical articles of manufacture that can be used by an EDA product to verify that the integrated circuit, when manufactured, performs according to the specified design. The netlist can be optimized for a target semiconductor manufacturing technology. Additionally, the finished integrated circuit may be tested to verify that the integrated circuit satisfies the requirements of the specification.

During netlist verification 720, the netlist is checked for compliance with timing constraints and for correspondence with the HDL code. During design planning 722, an overall floor plan for the integrated circuit is constructed and analyzed for timing and top-level routing.

During layout or physical implementation 724, physical placement (positioning of circuit components such as transistors or capacitors) and routing (connection of the circuit components by multiple conductors) occurs, and the selection of cells from a library to enable specific logic functions can be performed. As used herein, the term 'cell' may specify a set of transistors, other components, and interconnections that provides a Boolean logic function (e.g., AND, OR, NOT, XOR) or a storage function (such as a flipflop or latch). As used herein, a circuit 'block' may refer to two or more cells. Both a cell and a circuit block can be referred to as a module or component and are enabled as both physical structures and in simulations. Parameters are specified for selected cells (based on 'standard cells') such as size and made accessible in a database for use by EDA products.

During analysis and extraction 726, the circuit function is verified at the layout level, which permits refinement of the layout design. During physical verification 728, the layout design is checked to ensure that manufacturing constraints are correct, such as DRC constraints, electrical constraints, lithographic constraints, and that circuitry function matches the HDL design specification. During resolution enhancement 730, the geometry of the layout is transformed to improve how the circuit design is manufactured.

During tape-out, data is created to be used (after lithographic enhancements are applied if appropriate) for production of lithography masks. During mask data preparation 732, the 'tape-out' data is used to produce lithography masks that are used to produce finished integrated circuits.

A storage subsystem of a computer system (such as computer system 800 of FIG. 8) may be used to store the programs and data structures that are used by some or all of the EDA products described herein, and products used for development of cells for the library and for physical and logical design that use the library.

Figure 8:
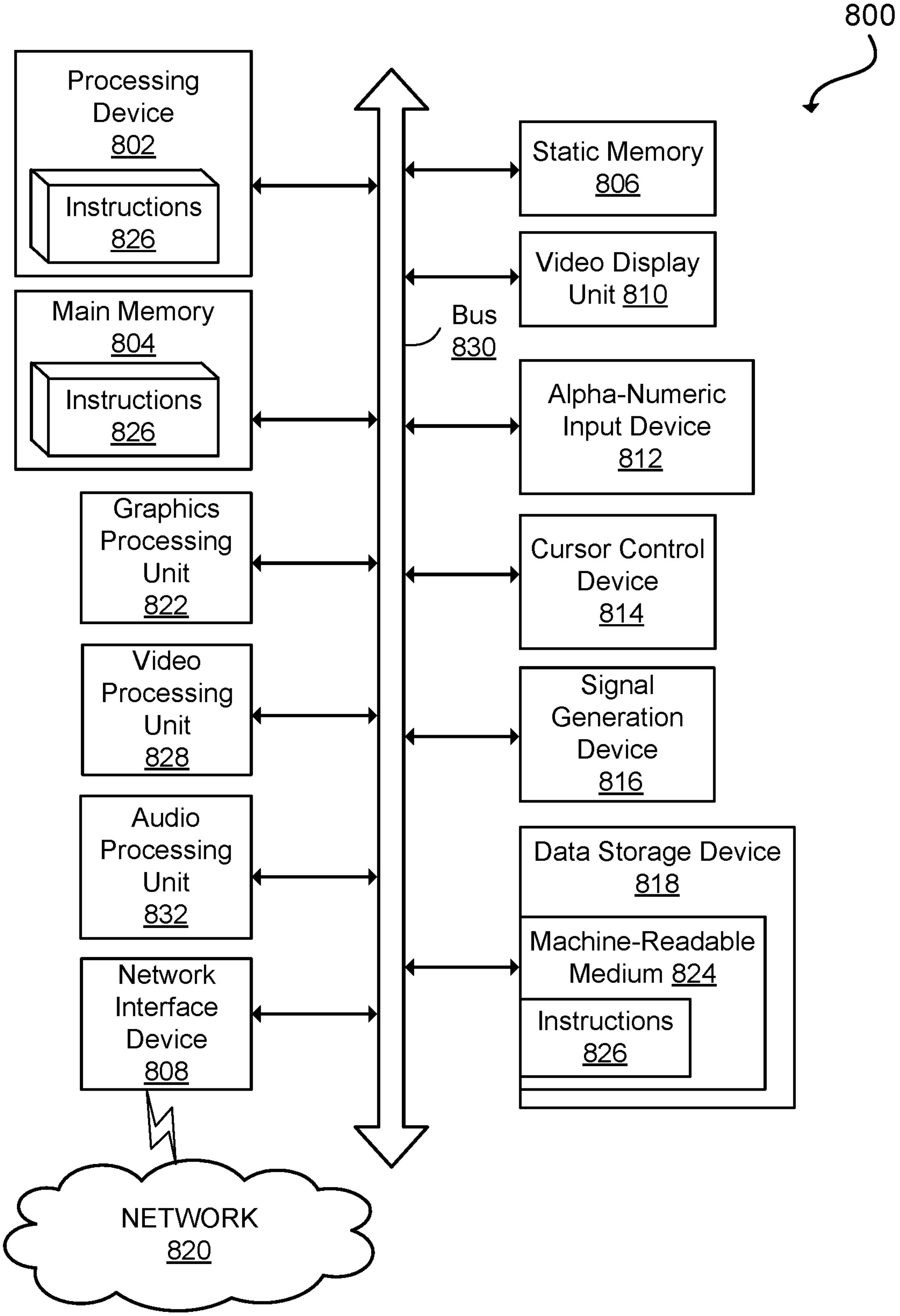
FIG. 8 depicts a diagram of an example computer system in which embodiments of the present disclosure may operate.

FIG. 8 illustrates an example machine of a computer system 800 within which a set of instructions, for causing the machine to perform any one or more of the methodologies discussed herein, may be executed. In alternative implementations, the machine may be connected (e.g., networked) to other machines in a LAN, an intranet, an extranet, and/or the Internet. The machine may operate in the capacity of a server or a client machine in client-server network environment, as a peer machine in a peer-to-peer (or distributed) network environment, or as a server or a client machine in a cloud computing infrastructure or environment.

The machine may be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 800 includes a processing device 802, a main memory 804 (e.g., read-only memory (ROM), flash memory, dynamic random access memory (DRAM) such as synchronous DRAM (SDRAM), a static memory 806 (e.g., flash memory, static random access memory (SRAM), etc.), and a data storage device 818, which communicate with each other via a bus 830.

Processing device 802 represents one or more processors such as a microprocessor, a central processing unit, or the like. More particularly, the processing device may be complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 802 may also be one or more special-purpose processing devices such as an application specific integrated circuit (ASIC), a field programmable gate array (FPGA), a digital signal processor (DSP), network processor, or the like. The processing device 802 may be configured to execute instructions 826 for performing the operations and steps described herein.

The computer system 800 may further include a network interface device 808 to communicate over the network 820. The computer system 800 also may include a video display unit 810 (e.g., a liquid crystal display (LCD) or a cathode ray tube (CRT)), an alphanumeric input device 812 (e.g., a keyboard), a cursor control device 814 (e.g., a mouse), a graphics processing unit 822, a signal generation device 816 (e.g., a speaker), graphics processing unit 822, video processing unit 828, and audio processing unit 832.

The data storage device 818 may include a machine-readable storage medium 824 (also known as a non-transitory computer-readable medium) on which is stored one or more sets of instructions 826 or software embodying any one or more of the methodologies or functions described herein. The instructions 826 may also reside, completely or at least partially, within the main memory 804 and/or within the processing device 802 during execution thereof by the computer system 800, the main memory 804 and the processing device 802 also constituting machine-readable storage media.

In some implementations, the instructions 826 include instructions to implement functionality corresponding to the present disclosure. While the machine-readable storage medium 824 is shown in an example implementation to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine and the processing device 802 to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm may be a sequence of operations leading to a desired result. The operations are those requiring physical manipulations of physical quantities. Such quantities may take the form of electrical or magnetic signals capable of being stored, combined, compared, and otherwise manipulated. Such signals may be referred to as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the present disclosure, it is appreciated that throughout the description, certain terms refer to the action and processes of a computer system, or similar electronic computing device, that manipulates and transforms data represented as physical (electronic) quantities within the computer system's registers and memories into other data similarly represented as physical quantities within the computer system memories or registers or other such information storage devices.

The present disclosure also relates to an apparatus for performing the operations herein. This apparatus may be specially constructed for the intended purposes, or it may include a computer selectively activated or reconfigured by a computer program stored in the computer. Such a computer program may be stored in a computer readable storage medium, such as, but not limited to, any type of disk including floppy disks, optical disks, CD-ROMs, and magnetic-optical disks, read-only memories (ROMs), random access memories (RAMs), EPROMS, EEPROMs, magnetic or optical cards, or any type of media suitable for storing electronic instructions, each coupled to a computer system bus.

The algorithms and displays presented herein are not inherently related to any particular computer or other apparatus. Various other systems may be used with programs in accordance with the teachings herein, or it may prove convenient to construct a more specialized apparatus to perform the method. In addition, the present disclosure is not described with reference to any particular programming language. It will be appreciated that a variety of programming languages may be used to implement the teachings of the disclosure as described herein.

The present disclosure may be provided as a computer program product, or software, that may include a machine-readable medium having stored thereon instructions, which may be used to program a computer system (or other electronic devices) to perform a process according to the present disclosure. A machine-readable medium includes any mechanism for storing information in a form readable by a machine (e.g., a computer). For example, a machine-readable (e.g., computer-readable) medium includes a machine (e.g., a computer) readable storage medium such as a read only memory ("ROM"), random access memory ("RAM"), magnetic disk storage media, optical storage media, flash memory devices, etc.

It should be understood that the sequence of steps of the processes described herein in regard to various methods and with respect various flowcharts is not fixed, but can be modified, changed in order, performed differently, performed sequentially, concurrently, or simultaneously, or altered into any desired order consistent with dependencies between steps of the processes, as recognized by a person of skill in the art. Further, as used herein and in the claims, the phrase "at least one of element A, element B, or element C" is intended to convey any of: element A, element B, element C, elements A and B, elements A and C, elements B and C, and elements A, B, and C.

In the foregoing disclosure, implementations of the disclosure have been described with reference to specific example implementations thereof. It will be evident that various modifications may be made thereto without departing from the broader spirit and scope of implementations of the disclosure as set forth in the following claims. Where the disclosure refers to some elements in the singular tense, more than one element can be depicted in the figures and like elements are labeled with like numerals. The disclosure and drawings are, accordingly, to be regarded in an illustrative sense rather than a restrictive sense.

What is claimed is:

1. A method comprising:

receiving an integrated circuit design comprising a plurality of design objects;

identifying a desired design object associated with a violation in the integrated circuit design;

extracting, by a processing device, a design tree from the integrated circuit design, the design tree corresponding to a portion of the integrated circuit design comprising the desired design object and extracted design objects associated with the desired design object;

connecting, by the processing device, the desired design object and the extracted design objects associated with the desired design object based on the connections in the integrated circuit design to generate a reduced design file smaller than the integrated circuit design, wherein the violation is reproducible based on the reduced design file; and generating a reduced test case based on the reduced design file, wherein the reduced test case contains the desired design object related to the violation, such that static verification of the reduced test case reproduces the violation.

2. The method of claim 1, wherein identifying the desired design object comprises:

receiving debug information associated with the violation, the debug information comprising a plurality of debug fields corresponding to design objects of the integrated circuit design;

assigning a priority to each of the debug fields corresponding to the design objects of the integrated circuit design; and identifying the desired design object based on a corresponding debug field of the plurality of debug fields having a highest priority.

3. The method of claim 1, further comprising:

receiving a user-reported issue associated with the violation, the user-reported issue comprising an identifier of a design object; and identifying the desired design object from among the plurality of design objects in the integrated circuit design based on the identifier of the design object.

4. The method of claim 1, wherein the extracting the design tree from the integrated circuit design comprises:

determining an object type of the desired design object; and traversing a portion of the integrated circuit design from the desired design object based on the object type to collect the extracted design objects.

5. The method of claim 4, further comprising determining one or more of hierarchy tree information and power supply information for each of the extracted design objects.

6. The method of claim 4, wherein the object type is a sink object type, and wherein the portion of the integrated circuit design is a fan-in cone to the desired design object from one or more sequential objects in the integrated circuit design.

7. The method of claim 4, wherein the object type is a source object type, and wherein the portion of the integrated circuit design is a fan-out cone from the desired design object to one or more sequential objects in the integrated circuit design.

8. The method of claim 4, wherein the object type is an intermediate object type, and wherein the portion of the integrated circuit design is a fan-in cone to and a fan-out cone from the desired design object, from one or more sequential objects in the fan-in cone through the desired design object to one or more sequential objects in the fan-out cone.

9. The method of claim 1, wherein the connecting the desired design object and the extracted design objects comprises:

for each design object in a design tree container comprising the desired design object and the extracted design objects:

getting a connected object list for the design object in the design tree container; and connecting the design object to each connected object in the connected object list if the connected object is in the design tree container.

10. The method of claim 1, wherein the reduced design file is in a format consistent with a hardware description language.

11. A system comprising:

a memory storing instructions; and a processor, coupled with the memory and to execute the instructions, the instructions when executed cause the processor to:

receive a reduced design file, the reduced design file storing a reduced design tree comprising a plurality of design objects representing a portion of an integrated circuit design, the reduced design tree being smaller than the integrated circuit design;

load the reduced design file;

generate a reduced test case based on the reduced design file, wherein the reduced test case contains a desired design object related to a violation; and generate a violation report using a static verification system on the reduced test case design file, the violation report comprising the violation that is also present in a second violation report generated using the static verification system on the integrated circuit design.

12. The system of claim 11, wherein the memory further stores instructions that, when executed cause the processor to:

load auxiliary data associated with the integrated circuit design; and ignore portions of the auxiliary data associated with objects that are present in the integrated circuit design and omitted from the reduced design tree.

13. The system of claim 12, wherein the auxiliary data comprises:

timing information; or power information.

14. The system of claim 11, wherein the memory further stores instructions that, when executed cause the processor to:

receive a user-reported issue associated with the second violation report; and generate a third violation report using a modified static verifier on the reduced design file, wherein the third violation report resolves the user-reported issue associated with the second violation report.

15. A non-transitory computer-readable medium comprising stored instructions, which when executed by a processor, cause the processor to:

receive an integrated circuit design comprising a plurality of design objects;

identify a desired design object associated with a violation in the integrated circuit design, the violation being detected by a static verifier;

extract a design tree from the integrated circuit design, the design tree corresponding to a portion of the integrated circuit design comprising the desired design object and extracted design objects associated with the desired design object;

connect the desired design object and the extracted design objects associated with the desired design object based on connections in the integrated circuit design to generate a reduced design file smaller than the integrated circuit design, wherein the violation detected by the static verifier is reproducible based on the reduced design file; and generate a reduced test case based on the reduced design file, wherein the reduced test case contains the desired design object related to the violation, such that static verification of the reduced test case reproduces the violation.

16. The non-transitory computer-readable medium of claim 15, wherein the instructions to identify the desired design object comprise instructions that, when executed, cause the processor to:

receive debug information associated with the violation, the debug information comprising a plurality of debug fields corresponding to design objects of the integrated circuit design;

assign a priority to each of the debug fields corresponding to the design objects of the integrated circuit design; and identify the desired design object based on a corresponding debug field of the plurality of debug fields having a highest priority.

17. The non-transitory computer-readable medium of claim 15, wherein the instructions to identify the desired design object comprise instructions that, when executed, cause the processor to:

receive a user-reported issue associated with the violation, the user-reported issue comprising an identifier of a design object; and identify the desired design object from among the plurality of design objects in the integrated circuit design based on the identifier of the design object.

18. The non-transitory computer-readable medium of claim 15, wherein the instructions to extract the design tree comprise instructions that, when executed, cause the processor to:

determine an object type of the desired design object; and traverse a portion of the integrated circuit design from the desired design object based on the object type to collect the extracted design objects, wherein, when the object type is a sink object type, the portion of the integrated circuit design is a fan-in cone to the desired design object from one or more sequential objects in the fan-in cone, wherein, when the object type is a source object type, the portion of the integrated circuit design is a fan-out cone from the desired design object to one or more sequential objects in the fan-out cone, and wherein, when the object type is an intermediate object type, the portion of the integrated circuit design is a fan-out cone and a fan-in cone to the desired design object from the one or more sequential objects in the fan-in cone through the desired design object to the one or more sequential objects in the fan-out cone.

19. The non-transitory computer-readable medium of claim 15, wherein the instructions to connect the desired design object to the extracted design objects comprise instructions that, when executed, cause the processor to:

for each design object in a design tree container comprising the desired design object and the extracted design objects:

get a connected object list for the design object in the design tree container; and connect the design object to each connected object in the connected object list if the connected object is in the design tree container.

20. The non-transitory computer-readable medium of claim 15, further storing instructions that, when executed, cause the processor to:

compute hierarchy tree information for each of the extracted design objects.

* * * * *